United States Patent
O'Donnell et al.

(10) Patent No.: US 7,668,354 B2
(45) Date of Patent: Feb. 23, 2010

(54) SYSTEM AND METHOD FOR TRACKING AND CLASSIFYING THE LEFT VENTRICLE OF THE HEART USING CINE-DELAYED ENHANCEMENT MAGNETIC RESONANCE

(75) Inventors: Thomas O'Donnell, New York, NY (US); Engin DiKici, Lawrenceville, NJ (US); Randolph M. Setser, Shaker Heights, OH (US); Richard D. White, Chagrin Falls, OH (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 897 days.

(21) Appl. No.: 11/372,783

(22) Filed: Mar. 10, 2006

(65) Prior Publication Data
US 2006/0253017 A1    Nov. 9, 2006

Related U.S. Application Data

(60) Provisional application No. 60/664,394, filed on Mar. 23, 2005.

(51) Int. Cl.
G06K 9/00 (2006.01)
A61B 6/00 (2006.01)

(52) U.S. Cl. .............................. 382/128; 382/274; 378/4

(58) Field of Classification Search ................ 382/100, 382/128, 129, 130, 131, 132, 133, 134, 168, 382/170, 181, 189, 199, 203, 209, 232, 255, 382/256, 260, 274, 276, 305; 600/410, 518, 600/420, 508; 378/4, 21, 24
See application file for complete search history.

(56) References Cited

U.S. PATENT DOCUMENTS

| 6,430,430 | B1 * | 8/2002 | Gosche | 600/410 |
|---|---|---|---|---|
| 6,741,881 | B2 * | 5/2004 | Prince | 600/420 |
| 6,785,409 | B1 * | 8/2004 | Suri | 382/128 |
| 6,904,306 | B1 * | 6/2005 | Wu et al. | 600/420 |
| 6,925,321 | B2 * | 8/2005 | Stefancik et al. | 600/419 |
| 7,346,388 | B2 * | 3/2008 | Elahi et al. | 600/518 |
| 2003/0187362 | A1 * | 10/2003 | Murphy et al. | 600/508 |

* cited by examiner

*Primary Examiner*—Seyed Azarian
(74) *Attorney, Agent, or Firm*—Donald B. Paschburg; F. Chau & Associates, LLC

(57) ABSTRACT

A system and method for tracking and classifying the left ventricle of the heart using cine-delayed enhancement magnetic resonance (Cine-DEMR) are provided. The method for tracking the left ventricle comprises: delineating myocardial borders of the left ventricle in an image of a first phase of a cardiac cycle of the heart; registering the image of the first phase with an image of a second phase of the cardiac cycle; copying the myocardial borders from the first phase onto the second phase; fitting the myocardial borders of the first phase to myocardial borders of the second phase; and refining the myocardial borders of the second phase.

18 Claims, 6 Drawing Sheets

SYSTEM AND METHOD FOR TRACKING AND CLASSIFYING THE LEFT VENTRICLE OF THE HEART USING CINE-DELAYED ENHANCEMENT MAGNETIC RESONANCE

CROSS-REFERENCE TO RELATED APPLICATION

This application claims the benefit of U.S. Provisional Application No. 60/664,394, filed Mar. 23, 2005, a copy of which is herein incorporated by reference.

BACKGROUND OF THE INVENTION

1. Technical Field

The present invention relates to a medical imaging modality for evaluating and quantifying necrotic cardiac tissue, and more particularly, to a system and method for tracking and classifying left ventricular tissue as viable or non-viable using cine-delayed enhancement magnetic resonance (Cine-DEMR).

2. Discussion of the Related Art

In the aftermath of a heart attack, the identification and assessment of non-viable (necrotic) tissue is necessary for effective development of intervention strategies and treatment plans for certain types of heart disease. For example, those tissues which are healthy or capable of recovery through coronary bypass, stent placement, etc., should be distinguished from those which are non-viable, or irreversibly damaged. In this manner, predictions may be made as to which patients might benefit from revascularization to increase their cardiac function and survival rate.

Physicians currently rely on several non-invasive indicators for determining viability of myocardial tissue. For example, the morphology of the myocardium, specifically its thinning, is evidence of necrotic tissue. In addition, abnormal motion, such as passive movement of a region or in extreme cases no movement at all can indicate myocardial damage. However, although morphology and functional changes are indicative of tissue abnormality, they are not sufficiently sensitive to differentiate abnormal from non-viable tissue.

Contrast enhanced imaging techniques may also be used to help identify non-viable regions. For example, positron-emission tomography (PET) and single-photon-emission tomography SPECT are capable of indicating viability information through differential signal intensity. However, these modalities are of limited utility as their resolution is quite low and are not generally available in the case of PET.

Another contrast enhanced imaging technique, DEMR, has been shown to enable direct visualization of non-viable myocardium. DEMR is an imaging technique in which non-viable myocardial tissue appears with increased signal intensity. DEMR is typically performed using a standard inversion recovery MR acquisition sequence 20-30 minutes after administration of a paramagnetic contrast agent (e.g., gado-pentetate dimeglumine (Gd-DTPA)). DEMR has been shown to have sufficient spatial resolution to accurately distinguish viable (normal or ischemic) from non-viable myocardium within the left ventricular wall.

Radiologists typically acquire DEMR images in conjunction with other functional modalities (e.g., Cine MR), and use domain knowledge and experience to isolate the non-viable tissues. One recently developed technique stemming from the acquisition of DEMR images in conjunction with Cine MR is Cine-DEMR. Cine-DEMR is targeted to the left ventricle (LV) and combines the advantages of both Cine MR and DEMR. Similar to Cine MR, Cine-DEMR displays the heart beating over time allowing for the detection of motion abnormalities used to determine cardiac health. Similar to DEMR, in Cine-DEMR, non-viable tissues appear with increased signal intensity allowing the amount of non-viable myocardium to be quantified.

In contrast to separate Cine MR and DEMR acquisitions, Cine-DEMR decreases scanning time by replacing two acquisitions with one thereby supplanting the mental integration of the two sequences with a fused simultaneous visualization. In addition, Cine-DEMR avoids the potential misregistration of the two separate image sequences. Further, with Cine-DEMR, the phase which best describes non-viable tissue is more likely to be imaged than in DEMR because more than one phase is acquired.

FIG. 1 includes a single-phase DEMR image (image (a)) showing non-viable regions with increased signal intensity (denoted by the arrow) and end-diastolic and end-systolic images (images (b and c)) from a mid-ventricular short axis Cine acquisition. In addition, FIG. 1 includes end-diastolic and end-systolic images (images (d and e)) from a 15-phase Cine-DEMR acquisition. As can be observed, unlike DEMR, non-viable tissue is visible in the end-diastolic and end-systolic Cine-DEMR images. Further, when non-viable tissue is not transmural, it is easier to see how healthy tissue moves in Cine-DEMR as compared to Cine because the healthy and non-healthy regions can be distinguished.

Although Cine-DEMR has both decreased spatial and temporal resolution as compared to individual Cine and DEMR sequences, in recent studies in which clinicians analyzed Cine-DEMR, Cine and DEMR images of the same individual have shown a strong correlation in the categorization of tissues. As such, a need exists for a technique that employs Cine-DEMR to analyze tissue in the LV to enable accurate and efficient diagnosis of heart disease.

SUMMARY OF THE INVENTION

The present invention provides a system and method for tracking and classifying the LV using Cine-DEMR.

In one embodiment of the present invention, a method for tracking a left ventricle of a heart using Cine-DEMR comprises: delineating myocardial borders of the left ventricle in an image of a first phase of a cardiac cycle of the heart; registering the image of the first phase with an image of a second phase of the cardiac cycle; copying the myocardial borders from the first phase onto the second phase; fitting the myocardial borders of the first phase to myocardial borders of the second phase; and refining the myocardial borders of the second phase.

The myocardial borders are manually drawn onto the image of the first phase, the image of the first phase is a first image of a cine-DEMR image sequence. The image of the second phase is a second image of the cine-DEMR image sequence. The myocardial borders represent an endocardium and an epicardium.

The myocardial borders are fit by performing an affine transformation. The myocardial borders of the second phase are refined by matching radial intensity profiles of the second phase with radial intensity profiles of the first phase.

The method further comprises classifying viable tissue from non-viable tissue. The viable and non-viable tissues are classified by using a trained support vector machine. The method further comprises: registering the image of the first phase with an image of a third phase of the cardiac cycle; copying the myocardial borders from the first phase onto the third phase; fitting the myocardial borders of the first phase to myocardial borders of the third phase; and refining the myocardial borders of the third phase.

In another embodiment of the present invention, a system for tracking a left ventricle of a heart using Cine-DEMR comprises: a memory device for storing a program; a processor in communication with the memory device, the processor operative with the program to: delineate myocardial borders of the left ventricle in an image of a first phase of a cardiac cycle of the heart; register the image of the first phase with an image of a second phase of the cardiac cycle; copy the myocardial borders from the first phase onto the second phase; fit the myocardial borders of the first phase to myocardial borders of the second phase; and refine the myocardial borders of the second phase.

The myocardial borders are manually drawn onto the image of the first phase, the image of the first phase is a first image of a cine-DEMR image sequence. The image of the second phase is a second image of the cine-DEMR image sequence. The cine-DEMR image sequence is acquired using an MR scanner.

The myocardial borders represent an endocardium and an epicardium. The myocardial borders are fit by performing an affine transformation. The myocardial borders of the second phase are refined by matching radial intensity profiles of the second phase with radial intensity profiles of the first phase.

The processor is further operative with the program code to classify viable tissue from non-viable tissue. The viable and non-viable tissues are classified by using a trained support vector machine. The processor is further operative with the program code to: register the image of the first phase with an image of a third phase of the cardiac cycle; copy the myocardial borders from the first phase onto the third phase; fit the myocardial borders of the first phase to myocardial borders of the third phase; and refine the myocardial borders of the third phase.

In yet another embodiment of the present invention, a method for tracking and classifying a left ventricle of a heart using a Cine-DEMR image sequence of a cardiac cycle of the heart comprises: delineating contours of the left ventricle in an image of a first phase of the cardiac cycle, wherein the contours represent an endocardium and an epicardium; registering the image of the first phase with an image of a second phase of the cardiac cycle; copying the contours from the first phase onto the second phase; fitting the contours of the first phase to contours of the second phase by performing an affine transformation; refining the contours of the second phase by matching radial intensity profiles of the second phase with radial intensity profiles of the first phase; and classifying live tissue from dead tissue by using a trained support vector machine.

The foregoing features are of representative embodiments and are presented to assist in understanding the invention. It should be understood that they are not intended to be considered limitations on the invention as defined by the claims, or limitations on equivalents to the claims. Therefore, this summary of features should not be considered dispositive in determining equivalents. Additional features of the invention will become apparent in the following description, from the drawings and from the claims.

DETAILED DESCRIPTION OF EXEMPLARY EMBODIMENTS

Figure 1A:
FIG. 1 illustrates two sets of images for comparing a Cine-DEMR study with separate Cine and DEMR studies.
Figure 1B:
Figure 1C:
Figure 1D:
Figure 1E:
Figure 2:
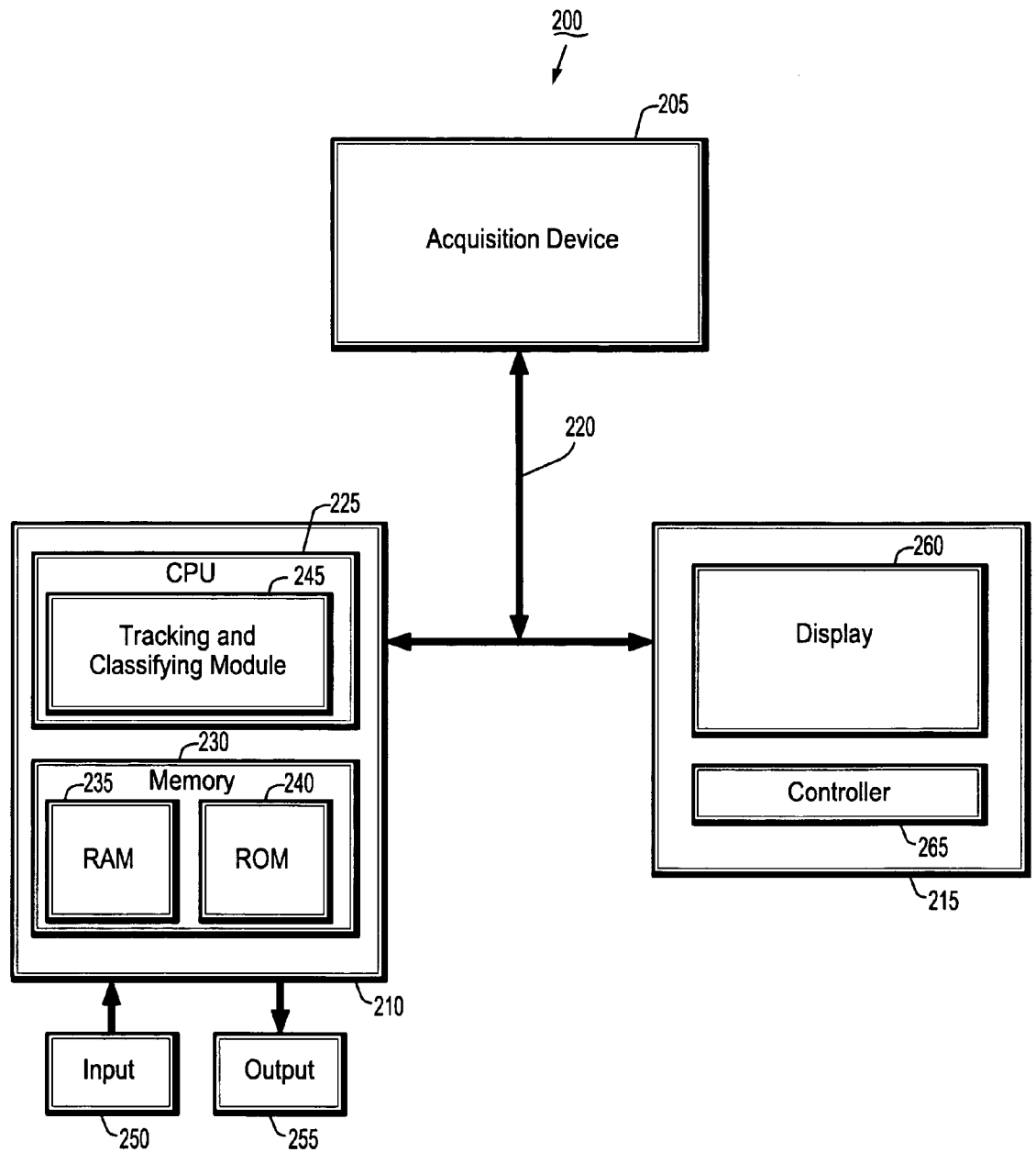
FIG. 2 is a block diagram of a system for tracking and classifying the LV using Cine-DEMR according to an exemplary embodiment of the present invention.

FIG. 2 is a block diagram of a system 200 for tracking and classifying the LV using Cine-DEMR according to an exemplary embodiment of the present invention.

As shown in FIG. 2, the system 200 includes, inter alia, an acquisition device 205 such as an MRI device, a PC 210 and an operator's console 215 connected over a wired or wireless network 220.

The PC 210, which may be a portable or laptop computer, a medical diagnostic imaging system or a picture archiving communications system (PACS) data management station, includes a CPU 225 and a memory 230, connected to an input device 250 and an output device 255. The CPU 225 includes a tracking and classifying module 245 that includes one or more methods for tracking and classifying the LV to be discussed hereinafter with reference to FIGS. 3-6.

It is to be understood that the tracking and classifying module 245 could be two separate modules with one module embodying a tracking portion and the other module embodying a classifying potion. In addition, the module 245 could be located outside the CPU 225.

The memory 230 includes a RAM 235 and a ROM 240. The memory 230 can also include a database, disk drive, tape drive, etc., or a combination thereof. The RAM 235 functions as a data memory that stores data used during execution of a program in the CPU 225 and is used as a work area. The ROM 240 functions as a program memory for storing a program executed in the CPU 225. The input 250 is constituted by a keyboard, mouse, etc., and the output 255 is constituted by an LCD, CRT display, or printer.

The operation of the system 200 may be controlled from the operator's console 215, which includes a controller 265, for example, a keyboard, and a display 260. The operator's console 215 communicates with the PC 210 and the acquisition device 205 so that image data collected by the acquisition device 205 can be rendered by the PC 210 and viewed on the display 260.

It is to be understood that the PC 210 can be configured to operate and display information provided by the acquisition device 205 absent the operator's console 215, using, for example, the input 250 and output 255 devices to execute certain tasks performed by the controller 265 and display 260.

The operator's console 215 may further include any suitable image rendering system/tool/application that can process digital image data of an acquired image dataset (or portion thereof) to generate and display images on the display 260. More specifically, the image rendering system may be an application that provides rendering and visualization of medical image data, and which executes on a general purpose or specific computer workstation.

Figure 3:
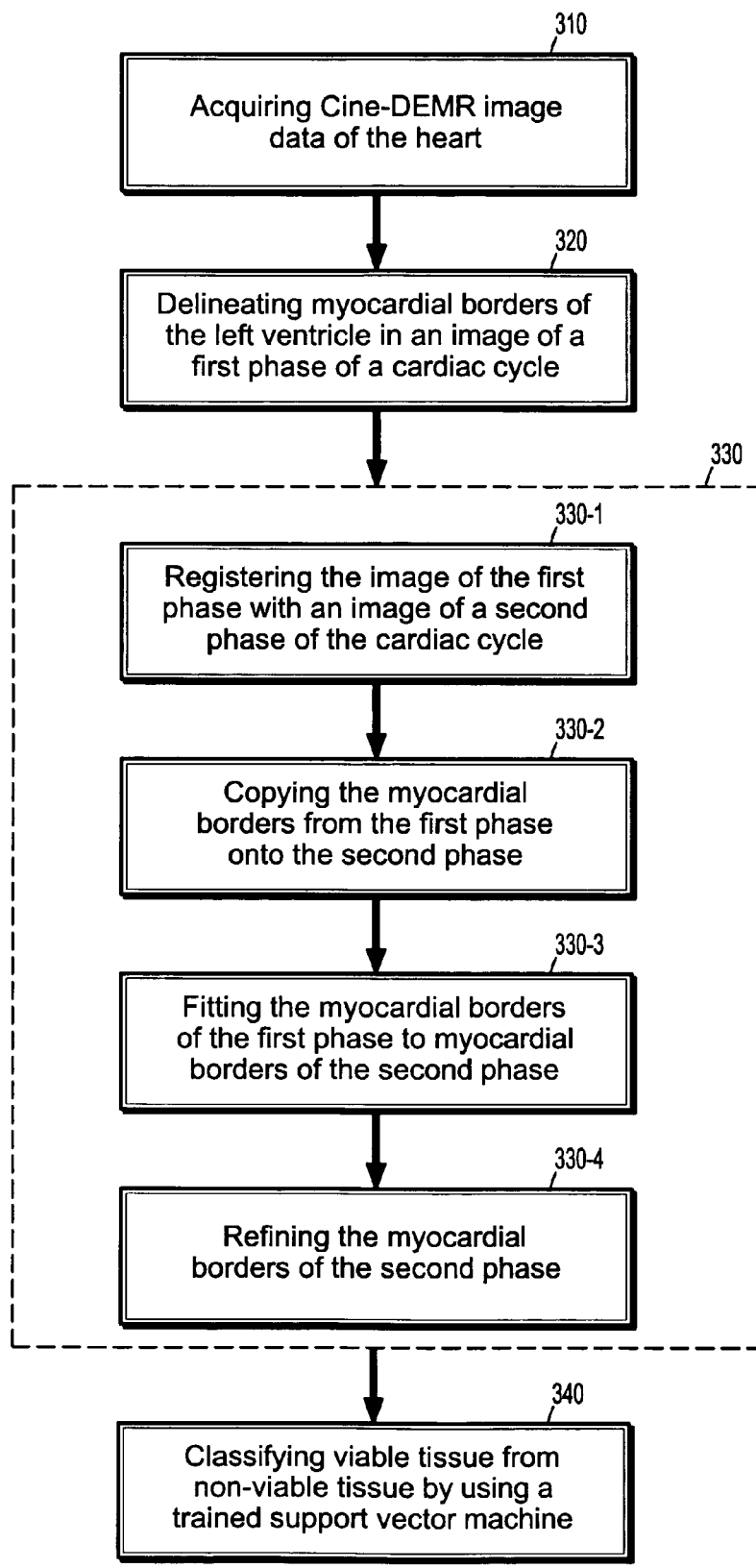
FIG. 3 is a flowchart illustrating a method for tracking and classifying the LV using Cine-DEMR according to an exemplary embodiment of the present invention.
Figure 4A:
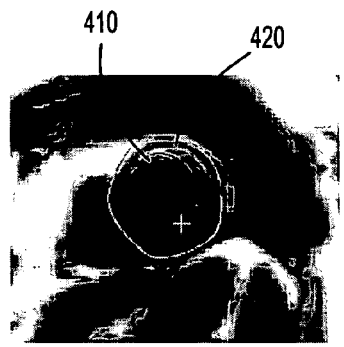
FIG. 4 is a sequence of images illustrating the method for tracking the LV of FIG. 3.
Figure 4B:
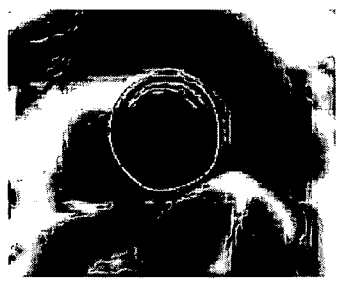
Figure 4C:
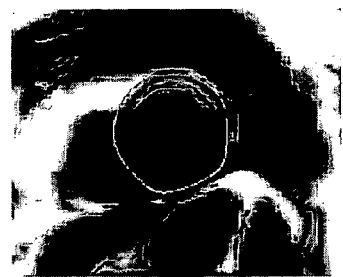
Figure 4D:
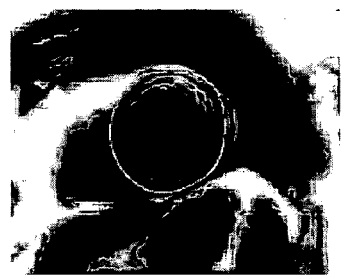
Figure 4E:
Figure 4F:
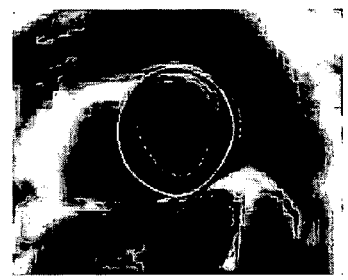
Figure 4G:
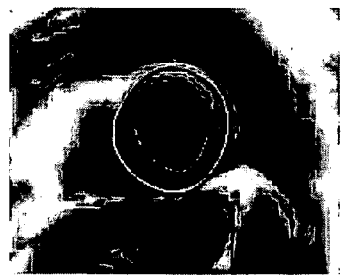
Figure 4H:
Figure 4I:
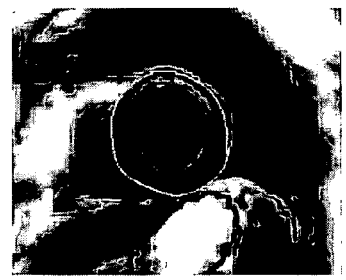

FIG. 3 is a flowchart showing an operation of a method for tracking and classifying the LV using Cine-DEMR according to an exemplary embodiment of the present invention.

As shown in FIG. 3, Cine-DEMR image data is acquired from the heart of a patient (310). This is accomplished by using the acquisition device 205. In this example a 1.5 T MR scanner employing the following typical acquisition parameters can be used: flip angle 50°, repetition time 2.5 ms, echo time 1.1 ms, bandwidth 1090 Hz/pixel, field-of-view 380 mm, rectangular field-of-view 75% and acquisition matrix 192×115 (frequency, phase). By default, 15 image frames may be acquired in each CINE-DEMR series, with a variable temporal spacing to cover the cardiac cycle. In addition, the images may be acquired during a single breath-hold approximately 10-20 minutes after intravenous injection of 40 ml of 0.5 mmol/ml Gd-DTPA.

It is to be understood that Cine-DEMR imaging is based on inversion recovery, single-shot, balanced steady state free precession (bSSFP) imaging. In Cine-DEMR imaging each image frame of an electrocardiograph (ECG)-triggered cine series is acquired during a separate RR-interval using a constant inversion time and image frames are acquired every other heart beat to allow magnetization recovery in the MR scanner. Thus, to create the cine series, a trigger delay is varied between image frames, resulting in a series of single-shot images, each from a different phase of the cardiac cycle.

After the Cine-DEMR image data is acquired and reconstructed, myocardial borders of the LV in an image of a first phase of the cardiac cycle are manually delineated (320). In other words, the myocardial borders are defined by a physician drawing a border around the endocardium and the epicardium of the LV using a mouse or a stylus pen. Once, the myocardial borders have been delineated, the myocardium of the LV is automatically segmented (330).

The theory and processes by which the automatic segmentation of the myocardium is derived will now be discussed. It is to be understood that in the following discussion the endocardium and the epicardium are occasionally referred to as inner and outer contours respectively.

Segmentation of the Myocardium

When segmenting the myocardium, first, let $\overline{C}_n$ represent a vector of the acquired Cine-DEMR images with n consecutive phases representing one spatial slice of the heart. Then, let $S_1(r)$ represent a contour manually drawn on phase 1 or the first phase. In other words, $S_1(r)$ represents the myocardial borders delineated by the physician in step 320.

Localization of the LV in Phases 2 ... n

The approximate position of the LV in phases k=2 ... n may be found through a non-rigid registration of $C_1$ with $C_k$, k=2 ... n. Thus, in step 330-1, the image of the first phase is registered with an image of a second or subsequent phase of the cardiac cycle. This results in a series of deformation fields $D_k$ such that $$C_1(\vec{x}) \mapsto C_k(D_k(\vec{x})), k=2 \ldots n$$

These deformation fields are then applied to $S_1(r)$, $r:0 \to 1$, to arrive at $$S_{localized_k}(r) = D_k(S_1(r)), k=2 \ldots n$$

The centroid of $S_{localized_i}(r)$, $$\vec{x}_{center_k} = \int_{S_{localized_k}} S_{localized_k}(r)\, dr$$

is the position from which the search for the LV in $C_k$, k= 2 ... n begins. Since this deformation is too imprecise for any other inferences and the resulting contour is too deformed to serve as a starting point for the next step of the procedure, $C_1$ is copied over to $C_k$ and centered on $\vec{x}_{center_k}$ resulting in $s_k'(r)$. Thus, in step 330-2, the myocardial borders from the first phase are copied onto the second phase.

Affine Transformation of Contours

Once the myocardial borders have been copied from the first phase to the second phase, they are deformed so that they fit the edges of the second phases (330-3). This is accomplished by deforming $S'_k(r)$ to fit the image $C_k$ by applying an affine deformation composed of five parameters: translation in the x and y dimensions $\vec{\tau}_k$, shearing parameters $$s_{q_k} \text{ and } s_{m_k} \text{ in } H_k(s_{q_k}, s_{m_k}) = \begin{pmatrix} 1 & s_{q_k} \\ s_{m_k} & 1 \end{pmatrix},$$

and a scaling parameter $\omega_k$. For example, the translation may be bound by the distance of 10 pixels, the shearing by ±60 degrees and the scaling by ±20%.

The affine parameters are adjusted to minimize an energy term made up of the components: $E_1$, $E_2$, and $E_3$ such that:

$$S_k''(r) = \underset{\tau_k, s_{q_k}, s_{m_k}, \omega_k}{\mathrm{ArgMax}} \begin{bmatrix} W_1 \int E_1(\omega_k H(s_{q_k}, s_{m_k}) S'_{k_{endo}}(r) + \tau_k)\, dr + \\ W_2 \int E_2(\omega_k H(s_{q_k}, s_{m_k}) S'_{k_{epi}}(r) + \tau_k)\, dr + \\ W_3 \oint E_3(\omega_k H(s_{q_k}, s_{m_k}) S'_{k:epi}(r) + \tau_k)\, dr \end{bmatrix}$$

The resulting contour $s_k''(r)$ may then serve as a starting point for a local refinement process.

Although the above-described process uses an affine transformation, since it strikes a balance between constraint and freedom, it is to be understood that a non-rigid registration could be used in place of the affine transformation.

Local Refinement of the Tracking

Over the course of the cardiac cycle, the shape of the LV deforms in a non-rigid manner. The affine transformation is only capable of representing this to a limited extent. However, the affine transformation does provide a basis from which to begin a less constrained search. Thus, in step 330-4, an ASM-like approach is used to refine $s_k''(r)$.

In step 330-4, the signatures of radial profiles in the neighborhoods of the inner and outer contours of $s_1(r)$ are determined. In doing so, $s_k''(r)$ is locally deformed such that the signature of its profiles in the neighborhoods of the inner and outer contours matches those of $s_1(r)$. These steps will now be discussed.

Profile Calculation

First, the inner and outer contours in j radial directions yielding profiles $\vec{p}_{kj_{endo}}(\rho)$ and $\vec{p}_{kj_{epi}}(\rho)$, k=1 ... n are sampled. The radial directions are centered at the centroid, $\vec{\mu}_k$, of $s_{1_{epi}}(r)$ or $s_{k_{epi}}''(r)$ (depending on k). Note: $\vec{\mu}_k$ may be different from $\vec{x}_{center_k}$ due to the affine transformation. The rays intersect $s_1(r)$ or $s_k''(r)$ (depending on k) at $\vec{q}_{kj_{endo}}$ and $\vec{q}_{kj_{epi}}$.

For a particular image k (the k subscript may be dropped here for clarity), profile $\vec{p}_j(\rho)$ (either for the inner contour $\vec{p}_{j_{endo}}(\rho)$ or outer contour $\vec{p}_{j_{epi}}(\rho)$) is a linear function of $\rho$, $$-\frac{\kappa}{2} \leq \rho \leq \frac{\kappa}{2}$$

centered at $\vec{q}_j$. Thus, $$\vec{p}_j(\rho) = ((\mu_x + rad_j - \frac{\kappa}{2} + \rho)\cos\phi_j, (\mu_y + rad_j - \frac{\kappa}{2} + \rho)\sin\phi_j),$$

where $rad_j = \sqrt{(\vec{\mu} - \vec{q}_j)^2}$, $\vec{\mu} = (\mu_x, \mu_y)$, and $\kappa$ is the length of the profile.

As shown below, the energy $\epsilon_{data}$ for matching the profiles is expressed as a function of the offset $\vec{v}_{kj}$ from $\vec{q}_{kj}$ (returning the k subscript), $$\varepsilon_{data}(\vec{v}_{kj}) = \int_{-\frac{\kappa}{2}}^{\frac{\kappa}{2}} (C_k(\vec{p}_{kj}(\rho) + \vec{v}_{kj}) - C_1(\vec{p}_{1j}(\rho)))^2 d\rho$$

This energy is minimal where the profile in image $C_k$, which is offset by $\vec{v}_{kj}$, best matches the profile in image $C_1$.

Refining the Contours

For the outer contour, the optimal offset is determined by simply minimizing $\epsilon_{data}(\vec{v}_{kj_{epi}})$ with respect to $\vec{v}_{kj_{epi}}$, where $$\vec{v}_{kj_{epi}} = \underset{\vec{v}'_{kj_{epi}}}{\text{ArgMin}} \varepsilon(\vec{v}'_{kj_{epi}}).$$

For each $s_{k_{epi}}''(r)$, a cubic spline is fit to the points ($\vec{q}_{kj_{epi}} + \vec{v}_{kj_{epi}}$), for all j, to form the final outer contour, $F_{k_{epi}}(r)$.

The fitting of the inner contour is less stable and requires a smoothing coefficient. This coefficient represents a tethering of the inner contour to the fixed outer contour with a spring which limits its deformation. For a given image, k=2 ... n (the k subscript may be dropped here for clarity), thus, $$\gamma(\vec{v}_{j_{endo}}) = 1 + \frac{|dist(\vec{q}'_{j_{epi}} - \vec{q}_{j_{endo}}) - dist(\vec{q}'_{j_{epi}} - (\vec{q}_{j_{endo}} + \vec{v}_{j_{endo}}))|}{dist(\vec{q}'_{j_{epi}} - \vec{q}_{j_{endo}})},$$

where $\vec{q}'_{j_{epi}}$ is the intersection in the radial direction with the final outer contour $F_{k_{epi}}(r)$. Therefore, the optimal offset for the inner contour is determined by minimizing with respect to $\vec{v}_{kj_{endo}}$ (returning the k subscript) such that, $$\vec{v}_{kj_{endo}} = \underset{\vec{v}'_{kj_{endo}}}{\text{ArgMin}} (\gamma(\vec{v}'_{kj_{endo}})\varepsilon(\vec{v}'_{kj_{endo}}))$$

Similarly, a cubic spline is fit to the points ($\vec{q}_{kj_{endo}} + \vec{v}_{kj_{endo}}$) to form the final contour $F_{k_{endo}}(r)$.

Referring now to FIG. 4, images (a-i) illustrate the tracking method described with reference to steps 320-330. For example, as shown in FIG. 4, image (a) illustrates a first contour 410 and a second contour 420 drawn onto a Cine-DEMR image representing a first frame of a cardiac cycle in step 320. The first contour 410 is an outline of the endocardium and the second contour 420 is an outline of the epicardium. As can be observed, once the first and second contours 410 and 420 have been drawn, step 330 is performed and the contours 410 and 420 are copied, fit and refined so that they may be tracked from the first frame to a second frame (image b), the first frame to the third frame (image c) and so forth for each remaining frame of the cardiac cycle (illustrated by images d-i).

Classification of Tissues

Referring back to FIG. 3, once the contours have been refined, viable tissue and non-viable tissue may be classified (340). In other words, healthy and dead tissues are quantified. This is accomplished by employing a trained support vector machine (SVM) to classify myocardial pixels once the myocardial borders have been detected.

When using the SVM, for the kernel function, a Gaussian radial basis function of the form:

$$k(\vec{\phi}(\vec{x}), \vec{\phi}(\vec{x}')) = e^{-\|\vec{\phi}(x) - \vec{\phi}(x')\|^2 / 2\tau^2}$$

where $\vec{\phi}$ is the feature vector may be used. Here, the feature vector $\vec{\phi}$ is made up of three components: 1) the intensity of a pixel relative to an average myocardial intensity; 2) the standard deviation of pixel intensities with respect to their neighbors; and 3) a "myocardial contrast" that is defined as the ratio of a mean myocardial intensity and a mean image intensity of the image. To determine $\sigma$ in the kernel as well as K, a compromise between maximizing the margin and minimizing the number of training set errors, also known as a "leave-one-out strategy" may be employed.

It is to be understood that in addition to using an SVM, other supervised learning techniques such as those which employ neural networks, decision trees or Bayesian classifiers could be used for classifying the myocardial pixels.

Experimental Results

Figure 5A:
FIG. 5 is a pair of images illustrating the method for tracking and classifying the LV of FIG. 3.
Figure 5B:
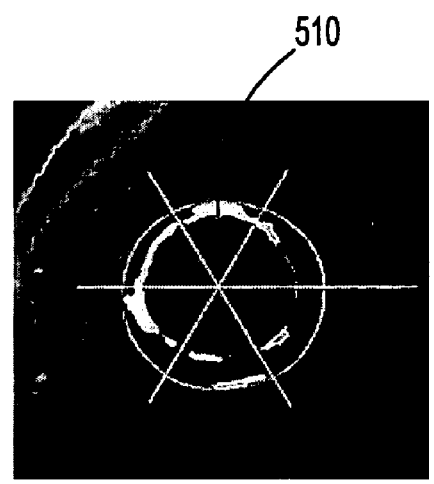
Figure 6:
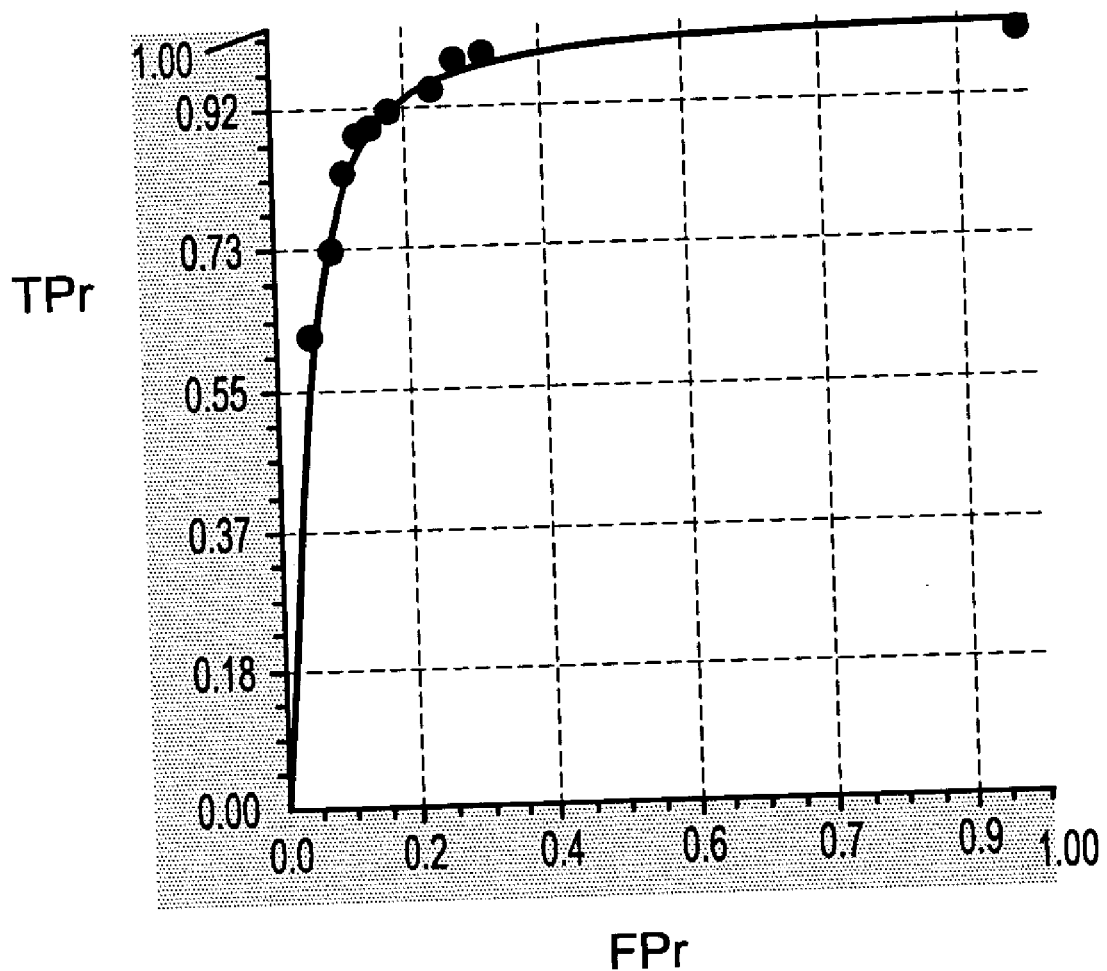
FIG. 6 is a receiver operating characteristic (ROC) curve illustrating results of the method for tracking and classifying the LV of FIG. 3.

An example of a Cine-DEMR image (image a) having steps 310-340 applied thereto is shown in FIG. 5. Here, the results of the tracking and classifying steps were compared with an unbiased ground truth provided by an expert. Three phases (e.g., frames 5, 10, and 15) from several patients were collected for a total of 15 images. In addition, an expert different from the one who provided the ground truth supplied the initial segmentation to initialize the tracking.

For the segmentation, 32 radial directions were used for the profiles. Both the inner and outer profiles had a pixel length of $\kappa$=5 and a search space for matching the profiles was three-square pixels. The tracking of the myocardial borders had an average error of 2.1 pixels over all the images. Regarding the classification of pixels as viable or non-viable, appropriate SVM parameters were found to be $\sigma$=0.01 and K=20. Non-viable pixels are illustrated by white pixels 510 in image (b) of FIG. 5. The experiments had a sensitivity of 80.76% and a specificity of 96.54% with 96.80% of the area covered under an ROC curve in FIG. 6. The general correctness rate was 93.46%.

Thus, according to an exemplary embodiment of the present invention, a semi-automatic quantification procedure that is capable of tracking the myocardial borders of the LV throughout a Cine-DEMR image sequence and classifying tissue of the borders as viable or non-viable may be used by a physician to identify and measure dead myocardial tissue, thereby decreasing the physician's analysis time and increasing the accuracy of the physician's diagnosis.

It is to be understood that although the techniques described above are applicable to 2D images, they may also be applicable to 3D images generated during an MR or volumetric delayed enhancement CT scan. For example, by adjusting the above techniques, a 3D model of the LV could be extracted in one phase rather than across a number of contours. The 3D model could then be deformed from one phase to the next using the same techniques described above for the contours. The classification approach could remain the same.

It should be understood that the present invention may be implemented in various forms of hardware, software, firmware, special purpose processors, or a combination thereof. In one embodiment, the present invention may be implemented in software as an application program tangibly embodied on a program storage device (e.g., magnetic floppy disk, RAM, CD ROM, DVD, ROM, and flash memory). The application program may be uploaded to, and executed by, a machine comprising any suitable architecture.

It is to be further understood that because some of the constituent system components and method steps depicted in the accompanying figures may be implemented in software, the actual connections between the system components (or the process steps) may differ depending on the manner in which the present invention is programmed. Given the teachings of the present invention provided herein, one of ordinary skill in the art will be able to contemplate these and similar implementations or configurations of the present invention.

It should also be understood that the above description is only representative of illustrative embodiments. For the convenience of the reader, the above description has focused on a representative sample of possible embodiments, a sample that is illustrative of the principles of the invention. The description has not attempted to exhaustively enumerate all possible variations. That alternative embodiments may not have been presented for a specific portion of the invention, or that further undescribed alternatives may be available for a portion, is not to be considered a disclaimer of those alternate embodiments. Other applications and embodiments can be implemented without departing from the spirit and scope of the present invention.

It is therefore intended, that the invention not be limited to the specifically described embodiments, because numerous permutations and combinations of the above and implementations involving non-inventive substitutions for the above can be created, but the invention is to be defined in accordance with the claims that follow. It can be appreciated that many of those undescribed embodiments are within the literal scope of the following claims, and that others are equivalent.

What is claimed is:

1. A method for tracking a left ventricle of a heart using cine-delayed enhancement magnetic resonance (Cine-DEMR), comprising:
    delineating myocardial borders of the left ventricle in an image of a first phase of a cardiac cycle of the heart;
    registering the image of the first phase with an image of a second phase of the cardiac cycle;
    copying the myocardial borders from the first phase onto the second phase;
    fitting the myocardial borders of the first phase to myocardial borders of the second phase; and
    refining the myocardial borders of the second phase;
    wherein the myocardial borders of the second phase are refined by matching radial intensity profiles of the second phase with radial intensity profiles of the first phase.

2. The method of claim 1, wherein the myocardial borders are manually drawn onto the image of the first phase, the image of the first phase is a first image of a cine-DEMR image sequence.

3. The method of claim 2, wherein the image of the second phase is a second image of the cine-DEMR image sequence.

4. The method of claim 1, wherein the myocardial borders represent an endocardium and an epicardium.

5. The method of claim 1, wherein the myocardial borders are fit by performing an affine transformation.

6. The method of claim 1, further comprising:
    classifying viable tissue from non-viable tissue.

7. The method of claim 6, wherein the viable and non-viable tissues are classified by using a trained support vector machine.

8. The method of claim 1, further comprising:
    registering the image of the first phase with an image of a third phase of the cardiac cycle;
    copying the myocardial borders from the first phase onto the third phase;
    fitting the myocardial borders of the first phase to myocardial borders of the third phase; and
    refining the myocardial borders of the third phase.

9. A system for tracking a left ventricle of a heart using cine-delayed enhancement magnetic resonance (Cine-DEMR), comprising:
    a memory device for storing a program;
    a processor in communication with the memory device, the processor operative with the program to:
    delineate myocardial borders of the left ventricle in an image of a first phase of a cardiac cycle of the heart;
    register the image of the first phase with an image of a second phase of the cardiac cycle;
    copy the myocardial borders from the first phase onto the second phase;
    fit the myocardial borders of the first phase to myocardial borders of the second phase; and
    refine the myocardial borders of the second phase;
    wherein—the myocardial borders of the second phase are refined by matching radial intensity profiles of the second phase with radial intensity profiles of the first phase.

10. The system of claim 9, wherein the myocardial borders are manually drawn onto the image of the first phase, the image of the first phase is a first image of a cine-DEMR image sequence.

11. The system of claim 10, wherein the image of the second phase is a second image of the cine-DEMR image sequence.

12. The system of claim 10, wherein the cine-DEMR image sequence is acquired using an MR scanner.

13. The system of claim 9, wherein the myocardial borders represent an endocardium and an epicardium.

14. The system of claim 9, wherein the myocardial borders are fit by performing an affine transformation.

15. The system of claim 9, wherein the processor is further operative with the program code to:
    classify viable tissue from non-viable tissue.

16. The system of claim 15, wherein the viable and non-viable tissues are classified by using a trained support vector machine.

17. The system of claim 9, wherein the processor is further operative with the program code to:
    register the image of the first phase with an image of a third phase of the cardiac cycle;
    copy the myocardial borders from the first phase onto the third phase;

fit the myocardial borders of the first phase to myocardial borders of the third phase; and refine the myocardial borders of the third phase.

18. A method for tracking and classifying a left ventricle of a heart using a cine-delayed enhancement magnetic resonance (Cine-DEMR) image sequence of a cardiac cycle of the heart, comprising:

delineating contours of the left ventricle in an image of a first phase of the cardiac cycle, wherein the contours represent an endocardium and an epicardium;

registering the image of the first phase with an image of a second phase of the cardiac cycle;

copying the contours from the first phase onto the second phase;

fitting the contours of the first phase to contours of the second phase by performing an affine transformation;

refining the contours of the second phase by matching radial intensity profiles of the second phase with radial intensity profiles of the first phase; and classifying live tissue from dead tissue by using a trained support vector machine.

* * * * *

UNITED STATES PATENT AND TRADEMARK OFFICE
CERTIFICATE OF CORRECTION

PATENT NO. : 7,668,354 B2  Page 1 of 1
APPLICATION NO. : 11/372783
DATED : February 23, 2010
INVENTOR(S) : O'Donnell et al.

It is certified that error appears in the above-identified patent and that said Letters Patent is hereby corrected as shown below:

TITLE PAGE; should read;

(73) Assignees: Siemens Medical Solutions USA, Inc., Malverne, PA (US);

The Cleveland Clinic Foundation, Cleveland, OH (US)

Signed and Sealed this

Twenty-third Day of November, 2010

David J. Kappos
*Director of the United States Patent and Trademark Office*

UNITED STATES PATENT AND TRADEMARK OFFICE
CERTIFICATE OF CORRECTION

PATENT NO. : 7,668,354 B2
APPLICATION NO. : 11/372783
DATED : February 23, 2010
INVENTOR(S) : O'Donnell et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1020 days.

Signed and Sealed this

Twenty-eighth Day of December, 2010

David J. Kappos
*Director of the United States Patent and Trademark Office*